(12) United States Patent
Toratani et al.

(10) Patent No.: US 8,525,252 B2
(45) Date of Patent: Sep. 3, 2013

(54) NONVOLATILE SEMICONDUCTOR MEMORY DEVICE AND METHOD OF FABRICATING THE SAME

(75) Inventors: Kenichiro Toratani, Kanagawa-ken (JP); Masayuki Tanaka, Kanagawa-ken (JP); Kazuhiro Matsuo, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 13/233,788

(22) Filed: Sep. 15, 2011

(65) Prior Publication Data

US 2012/0299083 A1 Nov. 29, 2012

(30) Foreign Application Priority Data

May 27, 2011 (JP) ................................. P2011-119467

(51) Int. Cl.
*H01L 29/792* (2006.01)

(52) U.S. Cl.
USPC .... 257/324; 257/325; 257/326; 257/E29.309; 257/E21.18

(58) Field of Classification Search
USPC ........ 257/314–326, E27.078, E29.3–E29.309
See application file for complete search history.

(56) References Cited

U.S. PATENT DOCUMENTS

| 7,812,391 | B2 | 10/2010 | Matsuo et al. |
| 8,008,707 | B2 | 8/2011 | Matsuo et al. |
| 2010/0038699 | A1* | 2/2010 | Katsumata et al. ............ 257/324 |
| 2010/0118610 | A1* | 5/2010 | Katsumata et al. ....... 365/185.18 |
| 2010/0140682 | A1* | 6/2010 | Kamioka et al. ............... 257/319 |
| 2010/0237400 | A1* | 9/2010 | Aoyama ........................ 257/324 |
| 2011/0127597 | A1* | 6/2011 | Fukuzumi et al. ............. 257/314 |
| 2012/0001250 | A1* | 1/2012 | Alsmeier ....................... 257/319 |

FOREIGN PATENT DOCUMENTS

JP 2010-34234 2/2010

OTHER PUBLICATIONS

U.S. Appl. No. 13/423,818, filed Mar. 19, 2012, Tanaka, et al.

\* cited by examiner

*Primary Examiner* — Mamadou Diallo
(74) *Attorney, Agent, or Firm* — Oblon, Spivak, McClelland, Maier & Neustadt, L.L.P.

(57) ABSTRACT

According to one embodiment, a nonvolatile semiconductor memory device includes a semiconductor region, a tunnel insulator provided above the semiconductor region, a charge storage insulator provided above the tunnel insulator, a block insulator provided above the charge storage insulator, a control gate electrode provided above the block insulator, and an interface region including a metal element, the interface region being provided at one interface selected from between the semiconductor region and the tunnel insulator, the tunnel insulator and the charge storage insulator, the charge storage insulator and the block insulator, and the block insulator and the control gate electrode.

9 Claims, 11 Drawing Sheets

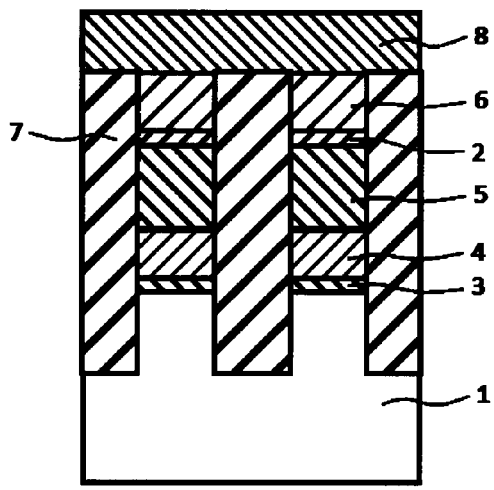
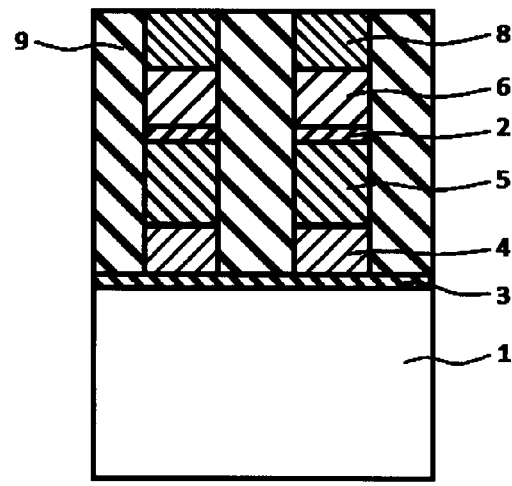
FIG.9A　　　　　　　　FIG.9B
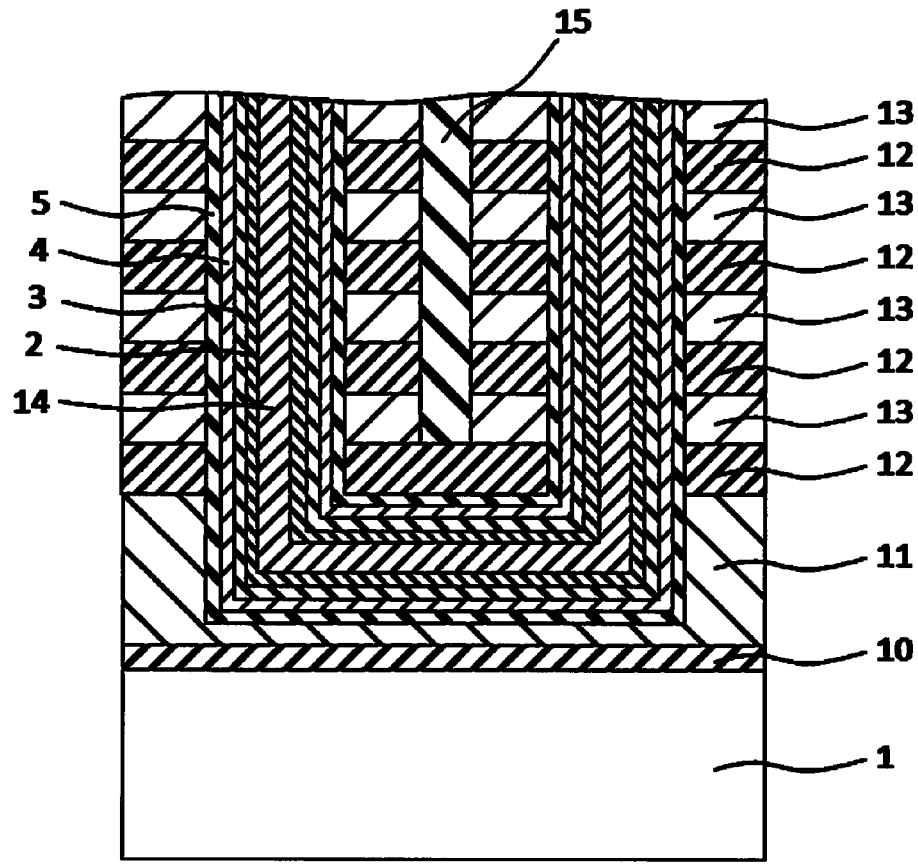
FIG.10

NONVOLATILE SEMICONDUCTOR MEMORY DEVICE AND METHOD OF FABRICATING THE SAME

CROSS REFERENCE TO RELATED APPLICATION

This application is based upon and claims the benefit of priority from prior Japanese Patent Application No. 2011-119467, filed on May 27, 2011, the entire contents of which are incorporated herein by reference.

FIELD

Embodiments relate to a nonvolatile semiconductor memory device and a method of fabricating the nonvolatile semiconductor memory device.

BACKGROUND

Cells in a MONOS (metal-oxide-nitride-oxide-silicon) type nonvolatile semiconductor memory device have recently been advanced to downsizing.

During writing in the MONOS type nonvolatile semiconductor memory device, it is necessary to suppress leakage current from a charge storage insulator through a block insulator into a gate electrode. Further, during erasing, it is necessary to suppress electron injection from the gate electrode into the charge storage insulator.

During charge retention, it is necessary to suppress leakage of accumulated electrons from the charge storage insulator by a tunnel insulator and the block insulator.

However, as cells become finer in scale and higher in density, it is necessary to reduce a film thickness of the tunnel insulator or the block insulator for use in memory cells. Therefore, during writing or erasing, during repeated writing or erasing, or during charge retention, there arises a problem that desired device characteristics and reliability cannot be achieved.

BRIEF DESCRIPTION OF THE DRAWINGS

FIGS. 9A and 9B are a cross-sectional view parallel to a word line direction and a cross-sectional view parallel to a bit line direction, respectively, showing a nonvolatile semiconductor memory device according to a fourth embodiment;

FIG. 10 is a cross-sectional view showing a nonvolatile semiconductor memory device according to a fifth embodiment;

DETAILED DESCRIPTION

According to one embodiment, a nonvolatile semiconductor memory device includes a semiconductor region, a tunnel insulator provided above the semiconductor region, a charge storage insulator provided above the tunnel insulator, a block insulator provided above the charge storage insulator, a control gate electrode provided above the block insulator, and an interface region including a metal element, the interface region being provided at one interface selected from between the semiconductor region and the tunnel insulator, the tunnel insulator and the charge storage insulator, the charge storage insulator and the block insulator, and the block insulator and the control gate electrode.

Embodiments will be described below with reference to the drawings.

(First Embodiment)

Figure 1A:
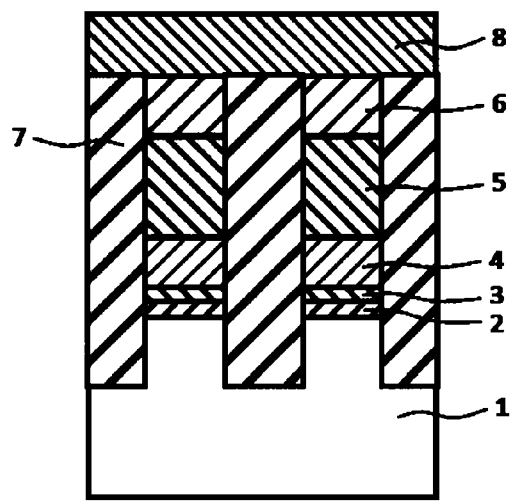
FIGS. 1A and 1B are a cross-sectional view parallel to a word line direction and a cross-sectional view parallel to a bit line direction, respectively, showing a nonvolatile semiconductor memory device according to a first embodiment.
Figure 1B:
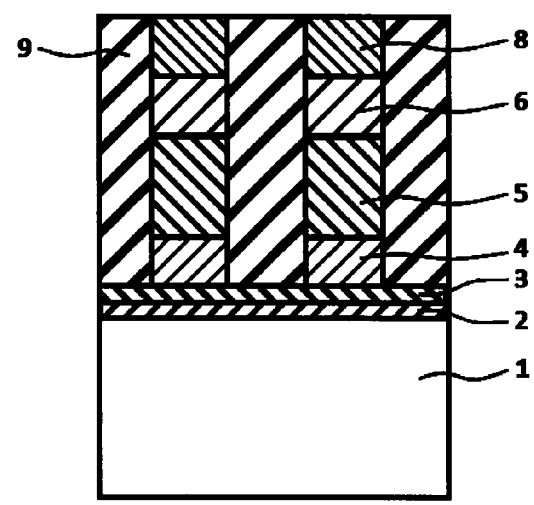

FIGS. 1A and 1B are cross-sectional views showing a nonvolatile semiconductor memory device according to a first embodiment, parallel to a word line direction and parallel to a bit line direction, respectively.

As shown in FIGS. 1A and 1B, an interface region 2 and a tunnel insulator 3 are provided above a semiconductor substrate 1. A layered film constituted with a charge storage insulator 4, a block insulator 5, and a control gate electrode 6, in sequence, is provided at an intersection of a bit line and a word line above the semiconductor substrate 1 thereby to produce an arrangement of a MONOS structure.

As shown in FIG. 1A, an element isolation insulator 7 is filled into an element isolation trench in the semiconductor substrate 1 so as to isolate the layered film. An upper electrode 8 extending in the word line direction is provided above the control gate electrode 6 and the element isolation insulator 7.

As shown in FIG. 1B, the charge storage insulator 4, the block insulator 5, and the control gate electrode 6 are stacked one on top of another in layers above the tunnel insulator 3, and also, an interlayer insulator 9 is provided so as to be in contact with a side surface of the upper electrode 8.

The nonvolatile semiconductor memory device according to the first embodiment will be described in detail below by use of the drawings.

The interface region 2 is provided on a surface of the semiconductor substrate 1. An aluminum oxide film, or an oxide film selected from magnesium oxide, calcium oxide, strontium oxide, lanthanum oxide, tungsten oxide, tantalum oxide, and the like, for example, (hereinafter called the aluminum oxide film or the like) is used for the interface region 2. It has been found out that the use of non-transition metal oxide such as aluminum oxide for the interface region 2, in particular, is highly effective in reducing leakage current or doing the like, to be described later.

Meanwhile, a layered structure of the aluminum oxide film or the like and a silicon oxide film may be used for the interface region 2. Here, the aluminum oxide film or the like is represented by A, the silicon oxide film is represented by O, and a silicon nitride film is represented by N. For example, a structure in which the aluminum oxide film or the like and the silicon oxide film are stacked one on top of another in layers in sequence, as viewed from the bottom, is represented by AO. A layered structure of AO, OA, AOA, or AONOA, stacked one on top of another in layers in sequence, as viewed from the bottom, for example, may be used for the interface region 2.

Incidentally, the interface region 2 may be made of a metallic element with a low surface density, and is not limited to being formed as a film. Even in such a case, the interface region 2 containing the metallic element functions as a single interface region, and achieves the effect of reducing the leakage current or doing the like.

Incidentally, it is to be understood that the metallic element contained in the interface region 2 is not limited only to a non-transition metal element, and the effect of reducing the leakage current or doing the like can be achieved even with a transition metal element such as hafnium (Hf), zirconium (Zr), lanthanum (La), titanium (Ti), or tantalum (Ta). In a case that the transition metal element is used for the interface region 2, such a process as to minimize oxygen defects is required at the time of formation of the interface region 2. For example, the process is to increase an oxidation time, to increase an oxidation temperature, or to do the like. Also, when the silicon oxide film is formed at an upper portion of the interface region 2, heat treatment, radical processing, or the like takes place in an atmosphere of oxidation, and a process to supply sufficient oxygen is required so as to reduce the oxygen defects.

Also, it is to be understood that the metallic element contained in the interface region 2 is not limited to the above. When different types of oxides and insulators are stacked one on top of another in layers, the metal insulator may be selected, provided that the effect of reducing the leakage current or doing the like can be achieved.

It has been found out that the effect of reducing the leakage current or doing the like to be described later is noticeable, when the surface density of the metallic element contained in the interface region 2 lies between $1 \times 10^{12}$ atoms/cm$^2$ and $1 \times 10^{16}$ atoms/cm$^2$, both inclusive, or particularly between $4 \times 10^{14}$ atoms/cm$^2$ and $3 \times 10^{15}$ atoms/cm$^2$, both inclusive. These surface densities correspond to thicknesses of 0.0003 to 3 nm and 0.1 to 1 nm, respectively, of the interface region 2. Incidentally, a thickness of an extra-thin film is herein defined as 0.0003 to 3 nm.

The tunnel insulator 3 is provided on a surface of the interface region 2. A silicon oxide film, for example, is used for the tunnel insulator 3. Also, a silicon oxide-nitride film may be used for the tunnel insulator 3. Besides, a multilayer structure of a silicon oxide film and a silicon nitride film may be used for the tunnel insulator 3. The tunnel insulator 3 has a film thickness on the order of 2 to 10 nm. The interface region 2 made of the extra-thin film is formed on the electron injection side, thus enabling an improvement in leakage characteristics.

The charge storage insulator 4 is provided above the tunnel insulator 3. A silicon nitride film having a film thickness on the order of 0.5 to 20 nm, for example, is used for the charge storage insulator 4. Incidentally, anything other than the silicon nitride film may be used for the charge storage insulator 4.

The block insulator 5 is provided above the charge storage insulator 4. A silicon oxide film, for example, is used for the block insulator 5. The block insulator 5 has a film thickness on the order of 1 to 20 nm, for example. Incidentally, the effect can be achieved in the same manner, even when, besides the silicon oxide film, a silicon oxide-nitride film or a layered structure of a silicon nitride film and a silicon oxide film is used for the block insulator 5.

The control gate electrode 6 is provided above the block insulator 5. A silicon film doped with impurities, for example, is used for the control gate electrode 6. However, besides, a metal film or a silicide film may be used.

The element isolation insulator 7 is filled into the element isolation trench provided in the semiconductor substrate 1. A top surface of the element isolation insulator 7 is substantially at the same level as a top surface of the control gate electrode 6, for example. A silicon oxide film, for example, is used for the element isolation insulator 7.

The upper electrode 8 is provided above the control gate electrode 6 and the element isolation insulator 7. A polycrystalline silicon doped with impurities, for example, is used for the upper electrode 8, and besides, a metal film such as TaN or tungsten (W), a silicide film such as CoSi or NiSi, or a layered film of these may be used.

The interlayer insulator 9 extending in the word line direction, which isolates a memory cell constituted with the tunnel insulator 3, the charge storage insulator 4, and the block insulator 5, is filled above the tunnel insulator 3.

Figure 2:
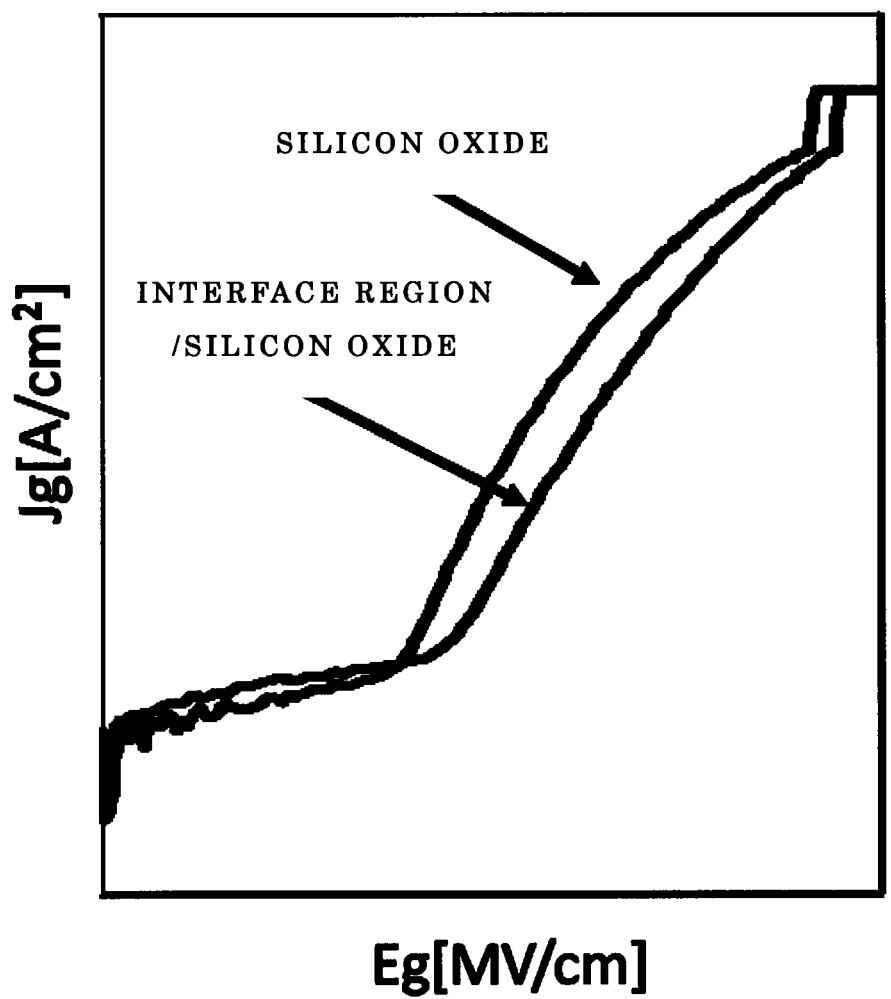
FIG. 2 is a diagram showing leakage characteristics of a layered film of a metal oxide film and a silicon oxide film in the nonvolatile semiconductor memory device according to the first embodiment.

FIG. 2 shows current characteristics as observed when electrons are injected into the silicon oxide film used for the tunnel insulator 3, and two types of insulators of a layered structure of the interface region 2 and the silicon oxide film. The insulator is an example of a MIS (Metal-Insulator-Semiconductor) structure formed between a silicon substrate and a gate electrode. Incidentally, in the structure, the aluminum oxide film is used for the interface region 2. In FIG. 2, the horizontal axis indicates an electric field applied to the insulators, and the vertical axis indicates current density. FIG. 2 shows an instance where a positive voltage is applied to the gate electrode, or equivalently, shows an instance where the electrons are injected from the silicon substrate side. As shown in FIG. 2, when the positive voltage is applied to the gate electrode, that is, when the electrons are injected into the silicon oxide film from a side of the interface region 2, the leakage current can be reduced, as compared to when the interface region 2 is not provided. Thus, during reading, the leakage current through the tunnel insulator 3 can be reduced. Thus, resistance to erroneous writing can be improved. Also, even with the tunnel insulator 3 having a reduced film thickness, a substantial increase in the leakage current does not take place, and thus, the tunnel insulator 3 can be reduced in film thickness. Thus, operating speed of the nonvolatile semiconductor memory device can be improved.

Figure 3:
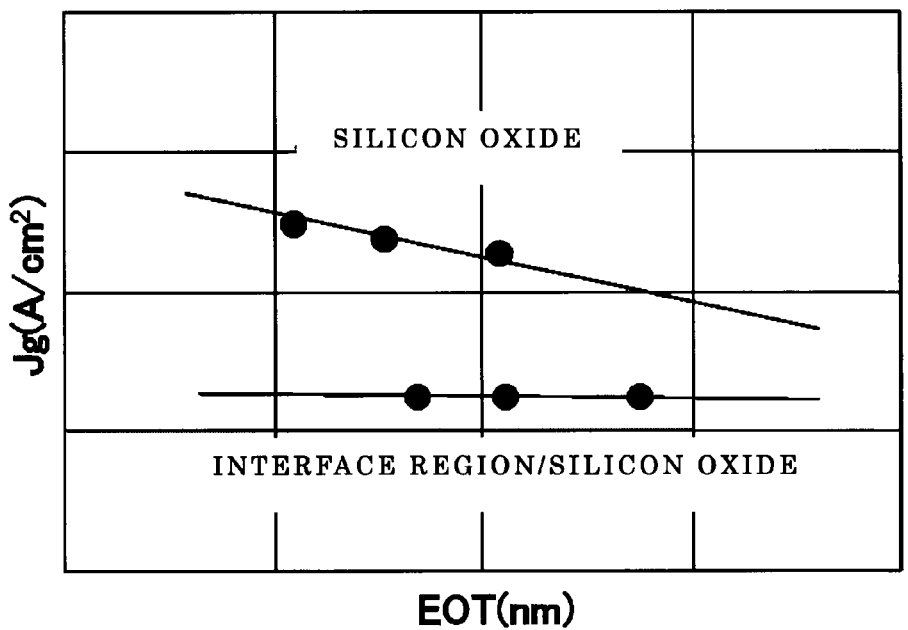
FIG. 3 is a diagram showing electrical capacitance film thickness and current characteristics of the layered film of the metal oxide film and the silicon oxide film in the nonvolatile semiconductor memory device according to the first embodiment.

Description will be given with regard to a relationship between electrical capacitance film thickness and leakage current of the insulator in the nonvolatile semiconductor memory device according to the first embodiment. FIG. 3 shows the electrical capacitance film thickness and the current characteristics of the layered film of the interface region 2 and the silicon oxide film corresponding to the tunnel insulator 3. In FIG. 3, the horizontal axis indicates the electrical capacitance film thickness estimated from current-voltage characteristics, and the vertical axis indicates the current density. As shown in FIG. 3, comparison at the same electric field has shown that an extra-thin metal oxide film is formed in a direction of electron injection, that is, an insulator structure is changed from a single layer of silicon oxide film to the layered structure of the silicon oxide film and the interface region 2, thereby enabling a reduction in the leakage current. Also, it has been confirmed that when electrons are injected from a direction opposite to the interface region 2, an increase in the leakage current or the like does not take place.

Figure 4:
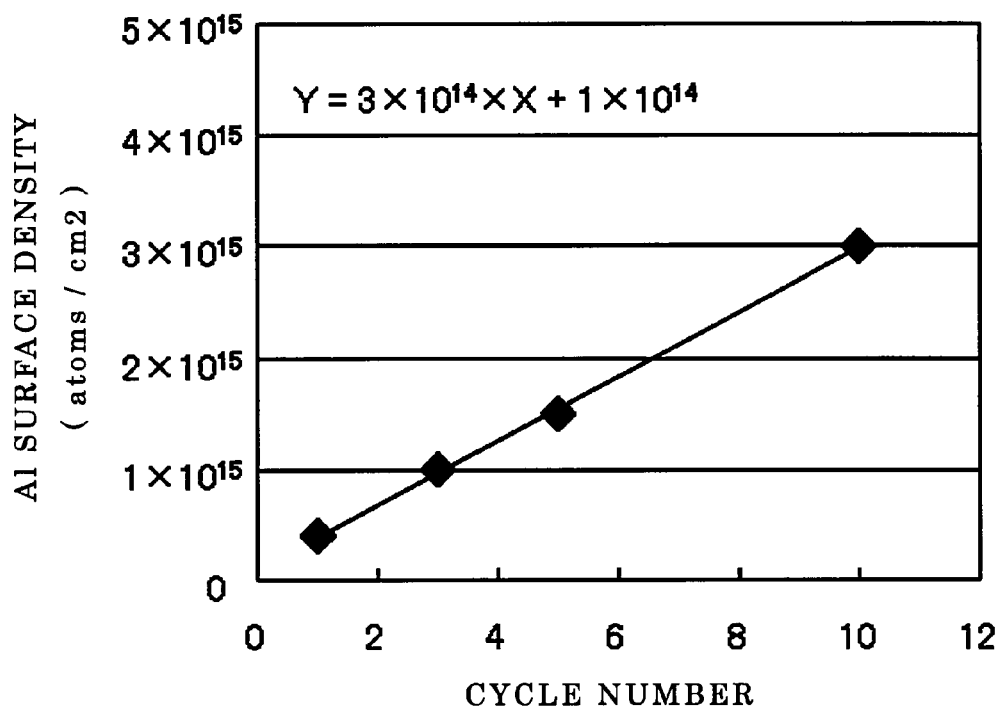
FIG. 4 is a chart showing a relationship between a number of cycles and aluminum (Al) surface density, as observed when the metal oxide film is made of an aluminum oxide film, in the nonvolatile semiconductor memory device according to the first embodiment.
Figure 5:
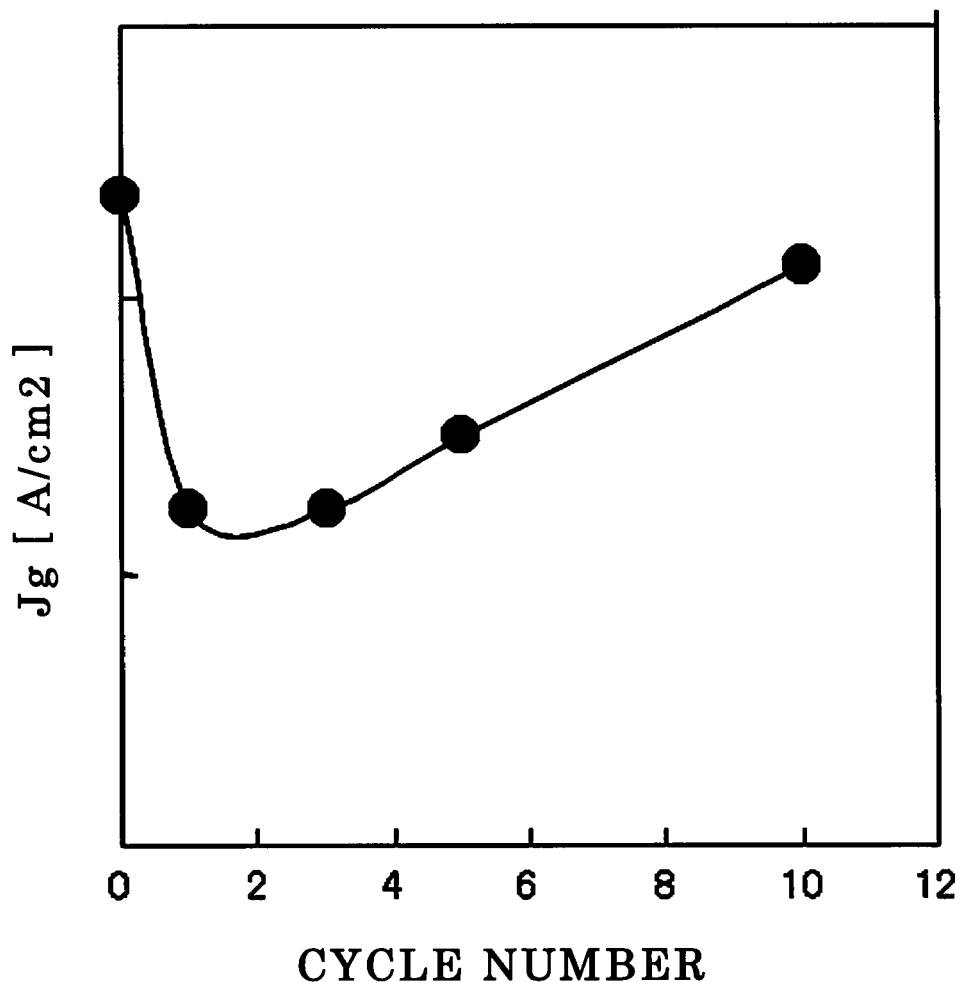
FIG. 5 is a chart showing the current characteristics relative to the number of cycles, as observed when the metal oxide film is made of the aluminum oxide film, in the nonvolatile semiconductor memory device according to the first embodiment.

FIG. 4 shows a relationship between a number of cycles and aluminum (Al) surface density, as observed when the interface region 2 is made of an aluminum oxide film. The aluminum surface density is determined by dissolving aluminum oxide in hydrofluoric acid, and measuring aluminum atoms by ICP-MS (Inductively Coupled Plasma Mass Spectrometry). FIG. 5 shows a relationship between the number of cycles and the leakage current, as observed when the interface region 2 is made of the aluminum oxide film. Here, the number of cycles of the aluminum oxide film refers to the following. When the aluminum oxide film is deposited by ALD (Atomic Layer Deposition), a series of processing steps that involves effecting chemisorption of reaction material as raw material on a substrate surface, and then evacuating excess reaction material and by-product is defined as a cycle. As shown in FIG. 4, the relationship between the number of cycles of the aluminum oxide and the aluminum surface density is expressed by Equation (1):

$$Y=3\times10^{14}\times X+1\times10^{14} \tag{1}$$

where X denotes the number of cycles of the aluminum oxide, and Y denotes the aluminum surface density.

When the aluminum oxide film is deposited in one cycle, it is assumed that the aluminum oxide film has a film thickness on the order of 0.1 nm. From Equation (1), the aluminum surface density is the order of $4\times10^{14}$ atoms/cm$^2$. When the aluminum oxide film is deposited in 10 cycles, it is assumed that the aluminum oxide film has a film thickness on the order of 1 nm, and from Equation (1), the aluminum surface density is the order of $3\times10^{15}$ atoms/cm$^2$.

As shown in FIG. 5, the presence of the aluminum oxide film between the silicon oxide films allows the leakage current to decrease by about an order of magnitude, as compared to the absence of the aluminum oxide film, that is, an instance where the number of cycles of the metal oxide film is equal to zero. When the number of cycles of the aluminum oxide film is equal to or more than one, the leakage current is increased with increasing the film thickness of the aluminum oxide film. When the number of cycles of the aluminum oxide film is about ten, about the same leakage current value as that in the absence of the aluminum oxide film is exhibited.

The aluminum surface density may be controlled over a wider range by changing adsorption conditions in the above-described method, or by using a method other than the above. Adsorption density of aluminum may be controlled over a wide range for example by a method that involves dissolving desired metal in a chemical solution and applying a coating of the metal, a method that involves spraying a liquid containing metal, or the like. From results of detailed studies using these methods, it has been found out that the effect can be achieved at or above an aluminum surface density of $1\times10^{12}$ atoms/cm$^2$. Also, it has been found out that at an aluminum surface density of $1\times10^{16}$ atoms/cm$^2$, the effect becomes nearly equal to that obtained when the aluminum oxide film is not formed.

According to the nonvolatile semiconductor memory device according to the first embodiment, the interface region 2 is provided between the semiconductor substrate and the tunnel insulator 3. Thus, during reading, the leakage current from the charge storage insulator 4 through the tunnel insulator 3 can be reduced.

Also, the metal oxide film is formed on the interface region 2, and thus, the tunnel insulator 3 with little deterioration by stress during writing or erasing can be formed. This points out that the metal oxide film is formed on an interface of the tunnel insulator 3 thereby to suppress formation of defects such as trapped charge due to stress application.

Incidentally, even when the metal oxide film is formed for example on an interface between the tunnel insulator 3 and the charge storage insulator 4 or between the charge storage insulator 4 and the block insulator 5, besides the interface between the semiconductor substrate 1 and the tunnel insulator 3, the same effect can be achieved in the interfaces.

Incidentally, a silicon nitride film (not shown) may be formed on the interface between the semiconductor substrate 1 and the tunnel insulator 3. This is for the purpose of suppressing the leakage current during application of high electric field, or suppressing surface deterioration of the tunnel insulator 3 in a process during fabrication. The interface region 2 containing the metallic element may be formed on an interface between the silicon nitride film and the tunnel insulator 3. Thereby, the above-described function of the silicon nitride film is imparted to the interface region 2, so that the advantageous effect of the first embodiment can be achieved.

A method of fabricating the nonvolatile semiconductor memory device according to the first embodiment will be described below.

FIGS. 6A to 6D are cross-sectional views parallel to the word line, showing the method of fabricating the nonvolatile semiconductor memory device according to the first embodiment.

An element isolation region to insulate an active region as a portion of a semiconductor substrate 1 on which a memory cell is to be formed is formed by a conventional method, and a diffusion layer is formed on the semiconductor substrate 1 by ion implantation.

Figure 6A:
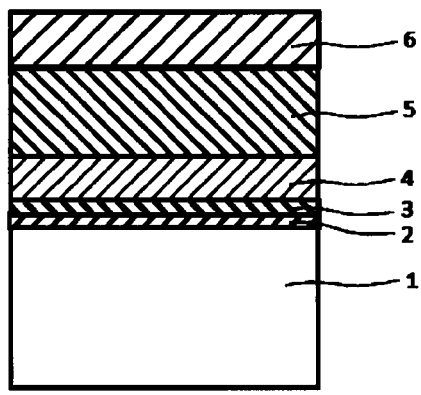
FIGS. 6A to 6D are cross-sectional views showing a method of fabricating the nonvolatile semiconductor memory device according to the first embodiment.

As shown in FIG. 6A, an aluminum oxide film is formed as an interface region 2 on a surface of the semiconductor substrate 1. Incidentally, an oxide film containing a metallic element other than aluminum may be formed as the interface region 2.

The aluminum oxide film is deposited for example by ALD (Atomic Layer Deposition). Formation is accomplished by introducing trimethyl aluminum and an oxidizing agent such as $O_2$, $O_3$, or $H_2O$ into a furnace, and allowing them to react with each other at about 300° C. Meanwhile, reduced pressure CVD (Chemical Vapor Deposition), PVD (Physical Vapor Deposition), sputtering, MBE (Molecular Beam Epitaxy), coating method, spray method, or the like may be used for the formation. The interface region 2 formed may be subjected to annealing in order to achieve high density, or may be subjected to an oxidation process in order to compensate for oxygen defects.

The interface region 2 is formed in a range from $1\times10^{12}$ atoms/cm$^2$ to $1\times10^{16}$ atoms/cm$^2$, both inclusive, in terms of aluminum surface density. Therefore, the interface region 2 is formed in a range from about 0.0003 to 3 nm in terms of thickness. According to the ALD, the interface region 2 can be formed at about $1\times10^{14}$ atoms/cm$^2$ with good controllability. Preferably, the interface region 2 is formed in a range from $4\times10^{14}$ atoms/cm$^2$ to $3\times10^{15}$ atoms/cm$^2$, both inclusive, or equivalently, in a range from 0.1 to 1 nm in terms of thickness.

A silicon oxide film, for example, is formed as a tunnel insulator 3 on a surface of the interface region 2. The tunnel insulator 3 is formed for example by CVD method or ALD (Atomic Layer Deposition).

A silicon nitride film, for example, is formed as a charge storage insulator 4 on a surface of the tunnel insulator 3. The charge storage insulator 4 is formed for example by reduced pressure CVD allowing dichlorosilane to react with ammonia at about 800° C.

A silicon oxide film, for example, is formed as a block insulator 5 above the charge storage insulator 4. The block insulator 5 is formed by reduced pressure CVD allowing dichlorosilane to react with nitrous oxide at about 800° C.

A silicon film doped with impurities is formed as a control gate electrode 6 above the block insulator 5. The control gate electrode 6 is formed for example by reduced pressure CVD allowing silane to react with phosphine at about 500° C.

A masking material such as a hard mask and a photoresist film is formed above the control gate electrode 6, and the masking material is processed by a conventional exposure process and fabrication process. As shown in FIG. 6B, an element isolation trench is formed by processing the control gate electrode 6, the block insulator 5, the charge storage insulator 4, the tunnel insulator 3, the interface region 2, and an upper portion of the semiconductor substrate 1, with the masking material acting as a mask.

Figure 6C:
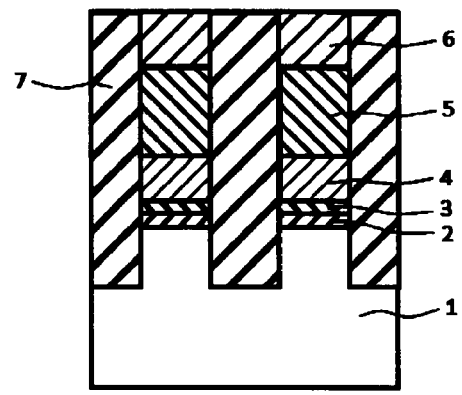
Figure 6B:
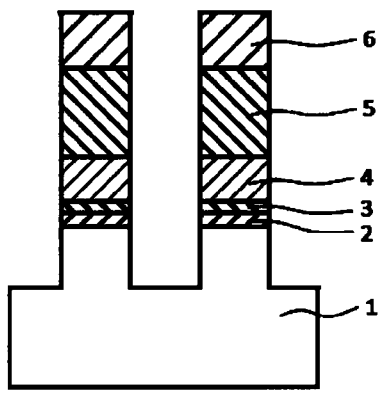

As shown in FIG. 6C, a silicon oxide film, for example, is formed as an element isolation insulator 7 in the element isolation trench. After that, the element isolation insulator 7 is polished by CMP (Chemical Mechanical Polishing) process thereby to expose the control gate electrode 6.

Figure 6D:
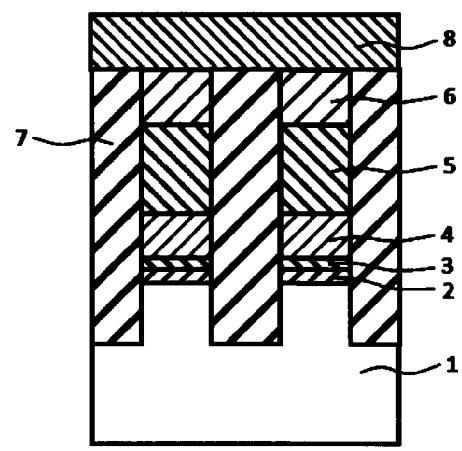

As shown in FIG. 6D, a silicon film doped with impurities, for example, is formed as an upper electrode above the control gate electrode 6 and the element isolation insulator 7.

The upper electrode 8, the control gate electrode 6, the block insulator 5, and the charge storage insulator 4 are processed parallel to the word line direction by RIE (Reactive Ion Etching) thereby to expose the tunnel insulator 3 and thus form an element isolation trench. A silicon oxide film, for example, is formed as an interlayer insulator 9 in the element isolation trench, and the interlayer insulator 9 is polished by CMP process. By the above, the nonvolatile semiconductor memory device is formed as shown in FIGS. 1A and 1B.

As described above, according to the first embodiment, the interface region 2 is provided between the semiconductor substrate 1 and the tunnel insulator 3. Thus, during reading, the leakage current through the tunnel insulator can be reduced, so that deterioration in element performance due to erroneous writing can be suppressed.

Further, even with the tunnel insulator 3 having a reduced film thickness, a substantial increase in the leakage current does not take place, and thus, the tunnel insulator 3 can be reduced in film thickness. Thus, the operating speed of the nonvolatile semiconductor memory device as a whole can be improved.

Also, the metal oxide film is formed on the interface region 2, and thus, the tunnel insulator 3 with little deterioration by stress during writing or erasing can be formed. This points out that the metal oxide film is formed on the interface of the tunnel insulator 3 thereby to suppress formation of defects such as trapped charge due to stress application.

The metal oxide film is formed on the interface region 2 thereby to reduce deterioration in the tunnel insulator 3 by stress during writing or erasing. A reduction in the deterioration eliminates defect formation or the like in the tunnel insulator 3 due to the stress, and hence, also enables an improvement in charge retention characteristics after the stress.

Further, when the interface region 2 is formed for example on the interface between the tunnel insulator 3 and the charge storage insulator 4, between the charge storage insulator 4 and the block insulator 5, or between the block insulator 5 and the control gate electrode 6, besides the interface between the semiconductor substrate 1 and the tunnel insulator 3, the above-described effect can be achieved in the interfaces.

(Second Embodiment)

Figure 7A:
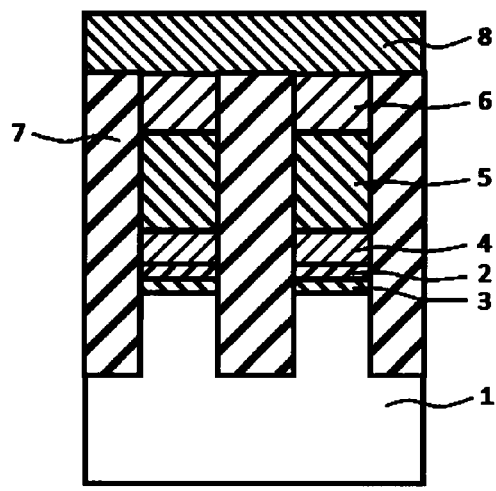
FIGS. 7A and 7B are a cross-sectional view parallel to a word line direction and a cross-sectional view parallel to a bit line direction, respectively, showing a nonvolatile semiconductor memory device according to a second embodiment.
Figure 7B:
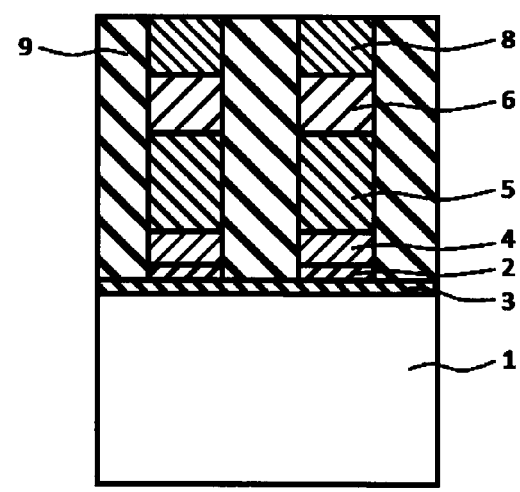

A nonvolatile semiconductor memory device according to a second embodiment will be described by use of FIGS. 7A and 7B. FIGS. 7A and 7B are cross-sectional views showing the nonvolatile semiconductor memory device according to the second embodiment, parallel to a word line direction and parallel to a bit line direction, respectively. As for a configuration of the second embodiment, the same portions as those of the configuration of the nonvolatile semiconductor memory device of the first embodiment shown in FIGS. 1A and 1B are designated by the same reference numerals, and detailed description of the same portions will be omitted. The second embodiment is different from the first embodiment in that an interface region 2 is provided between a tunnel insulator 3 and a charge storage insulator 4, rather than between a semiconductor substrate 1 and the tunnel insulator 3.

Description will be given with regard to a relationship between electrical capacitance film thickness and leakage current of the insulator in the nonvolatile semiconductor memory device according to the second embodiment. As in the case of the first embodiment, as shown in FIG. 3, comparison at the same electric field has shown that an insulator structure is changed from a single layer of silicon oxide film to the layered structure of the silicon oxide film and the interface region 2, thereby enabling a reduction in the leakage current.

The interface region 2 is provided between the tunnel insulator 3 and the charge storage insulator 4 thereby to reduce tunnel current flowing from the charge storage insulator 4 through the tunnel insulator 3 and hence reduce the leakage current from the charge storage insulator 4. Therefore, retention characteristics of the nonvolatile semiconductor memory device according to the second embodiment can be improved.

The metal oxide film is formed on the interface region 2 thereby to reduce deterioration in the tunnel insulator 3 by stress during writing or erasing. A reduction in the deterioration eliminates defect formation or the like in the tunnel insulator 3 due to the stress, and hence, also enables an improvement in charge retention characteristics after the stress.

Even when the interface region 2 is formed for example on the interface between the semiconductor substrate 1 and the tunnel insulator 3, between the charge storage insulator 4 and a block insulator 5, or between the block insulator and a control gate electrode 6, besides the interface between the tunnel insulator 3 and the charge storage insulator 4, the above-described effect can be achieved in the interfaces.

(Third Embodiment)

Figure 8A:
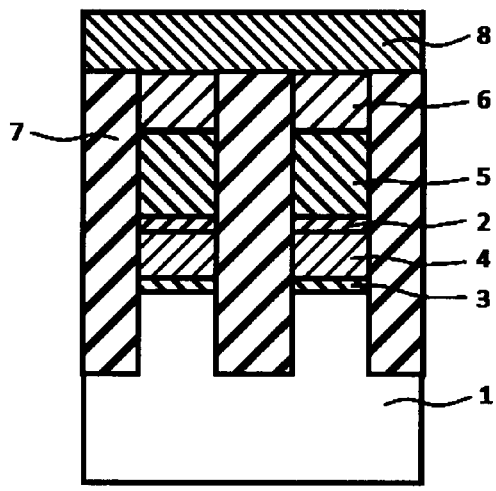
FIGS. 8A and 8B are a cross-sectional view parallel to a word line direction and a cross-sectional view parallel to a bit line direction, respectively, showing a nonvolatile semiconductor memory device according to a third embodiment.
Figure 8B:
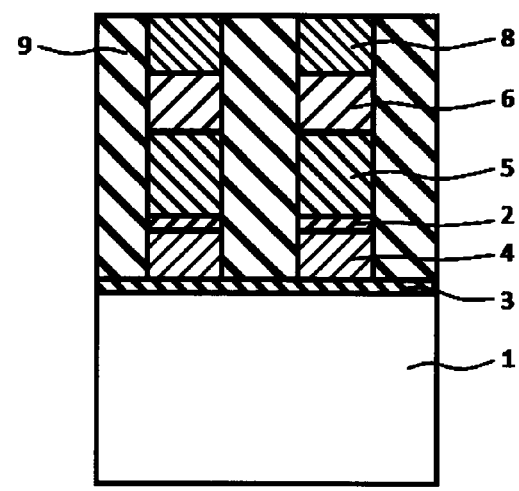

A nonvolatile semiconductor memory device according to a third embodiment will be described by use of FIGS. 8A and 8B. FIGS. 8A and 8B are cross-sectional views showing the nonvolatile semiconductor memory device according to the third embodiment, parallel to a word line direction and parallel to a bit line direction, respectively.

As for a configuration of the third embodiment, the same portions as those of the configuration of the nonvolatile semiconductor memory device of the first embodiment shown in FIGS. 1A and 1B are designated by the same reference numerals, and detailed description of the same portions will be omitted. The third embodiment is different from the first embodiment in that an interface region 2 is provided between a charge storage insulator 4 and a block insulator 5, rather than between a semiconductor substrate 1 and a tunnel insulator 3.

Description will be given with regard to a relationship between electrical capacitance film thickness and leakage current of the insulator in the nonvolatile semiconductor memory device according to the third embodiment. Shown are the electrical capacitance film thickness and the current characteristics of a layered film of the interface region and a silicon oxide film corresponding to the block insulator 5. As in the case of the first embodiment, as shown in FIG. 3, comparison at the same electric field has shown that an insulator structure is changed from a single layer of silicon oxide film to the layered structure of the silicon oxide film and the interface region 2, thereby enabling a reduction in the leakage current.

The interface region 2 is provided between the charge storage insulator 4 and the block insulator 5, thereby enabling a reduction in the leakage current from the charge storage insulator 4 through the block insulator 5. Thus, for a voltage applied during writing, the leakage current from the charge storage insulator 4 into the block insulator is reduced, and thus, leakage of charge into an upper electrode 8 can be prevented, so that writing speed can be improved.

When the same electric field is applied, the leakage current can be reduced, and thus, the block insulator 5 can be reduced in film thickness, so that the element can be speeded up. Leakage of accumulated charge from the charge storage insulator 4 can be suppressed, and thus, charge retention characteristics of the nonvolatile semiconductor memory device according to the third embodiment can be improved.

The metal oxide film is formed on the interface region 2 thereby to reduce deterioration in the block insulator 5 by stress during writing or erasing. A reduction in the deterioration eliminates defect formation or the like in the block insulator 5 due to the stress, and hence, also enables an improvement in the charge retention characteristics after the stress.

Even when the interface region 2 is formed for example on the interface between the semiconductor substrate 1 and the tunnel insulator 3, between the tunnel insulator 3 and the charge storage insulator 4, or between the block insulator 5 and a control gate electrode 6, besides the interface between the charge storage insulator 4 and the block insulator 5, the above-described effect can be achieved in the interfaces.

(Fourth Embodiment)

A nonvolatile semiconductor memory device according to a fourth embodiment will be described by use of FIGS. 9A and 9B. FIGS. 9A and 9B are cross-sectional views showing the nonvolatile semiconductor memory device according to the fourth embodiment, parallel to a word line direction and parallel to a bit line direction, respectively.

As for a configuration of the fourth embodiment, the same portions as those of the configuration of the nonvolatile semiconductor memory device of the first embodiment shown in FIGS. 1A and 1B are designated by the same reference numerals, and detailed description of the same portions will be omitted. The fourth embodiment is different from the first embodiment in that an interface region 2 is provided between a block insulator 5 and a control gate electrode 6, rather than between a semiconductor substrate 1 and a tunnel insulator 3.

Description will be given with regard to a relationship between electrical capacitance film thickness and leakage current of the insulator in the nonvolatile semiconductor memory device according to the fourth embodiment. Shown are the electrical capacitance film thickness and the current characteristics of a layered film of the interface region and a silicon oxide film corresponding to the block insulator 5. As in the case of the first embodiment, as shown in FIG. 3, comparison at the same electric field has shown that an insulator structure is changed from a single layer of silicon oxide film to the layered structure of the silicon oxide film and the interface region 2, thereby enabling a reduction in the leakage current.

The interface region 2 is provided between the block insulator 5 and the control gate electrode 6, and thus, for a voltage applied during erasing, insulating characteristics of the block insulator 5 during the erasing can be improved. Thus, during the erasing, charge injection from an upper electrode 8 into a charge storage insulator 4 can be suppressed, so that erasing speed can be improved. Further, when a constant electric field is applied, the leakage current can be reduced, and thus, the block insulator 5 can be reduced in film thickness, so that the element can be speeded up.

Incidentally, a silicon nitride film (not shown) may be formed on the interface between the block insulator 5 and the control gate electrode 6. This is for the purpose of suppressing the leakage current during application of high electric field, or suppressing surface deterioration of the tunnel insulator 3 in a process during fabrication. At this time, the interface region 2 containing the metallic element may be formed on the interface between the silicon nitride film and the tunnel insulator 3. Thereby, while the above-described function of the silicon nitride film is imparted to the interface region 2, the above-described effect can be achieved.

Further, the metal oxide film is formed on the interface region 2 thereby to reduce deterioration in the block insulator 5 by stress during writing or erasing. A reduction in the deterioration eliminates defect formation or the like in the block insulator 5 due to the stress, and hence, also enables an improvement in the charge retention characteristics after the stress.

Further, even when the interface region 2 is formed for example on the interface between the semiconductor substrate 1 and the tunnel insulator 3, between the tunnel insulator 3 and the charge storage insulator 4, or between the charge storage insulator 4 and the block insulator 5, besides the interface between the block insulator 5 and the control gate electrode 6, the above-described effect can be achieved in the interfaces.

(Fifth Embodiment)

A nonvolatile semiconductor memory device according to a fifth embodiment of the invention will be described below by use of the drawings. As for a configuration of the fifth embodiment, the same portions as those of the configuration of the nonvolatile semiconductor memory device of the first embodiment shown in FIGS. 1A and 1B are designated by the same reference numerals, and detailed description of the same portions will be omitted. FIG. 10 is a cross-sectional view showing the nonvolatile semiconductor memory device according to the fifth embodiment. FIGS. 11 to 14 are plan views showing a memory cell of the nonvolatile semiconductor memory device according to the fifth embodiment.

The nonvolatile semiconductor memory device according to the fifth embodiment is a three-dimensional nonvolatile semiconductor memory device constituted with a vertical transistor, as shown in FIG. 10. A back gate insulator 10 and a back gate conductor 11 are provided above a semiconductor substrate 1. Insulators 12 and electrode films 13 are stacked one on top of another in layers, alternating with each other, above the back gate conductor 11. Silicon oxide films, for example, are used for the insulators 12, and poly crystalline silicon, for example, is used for the electrode films 13. The electrode films 13 are used as a control gate electrode of the memory cell to be described later, and the insulators 12 have the function of providing insulation between the electrode films 13. Incidentally, FIG. 10 shows a structure in which the insulators 12 and the electrode films 13, four each, are stacked one on top of another in layers. However, a number of layers stacked is not so limited. An isolation insulator is provided so as to separate the electrode films 13.

Figure 11:
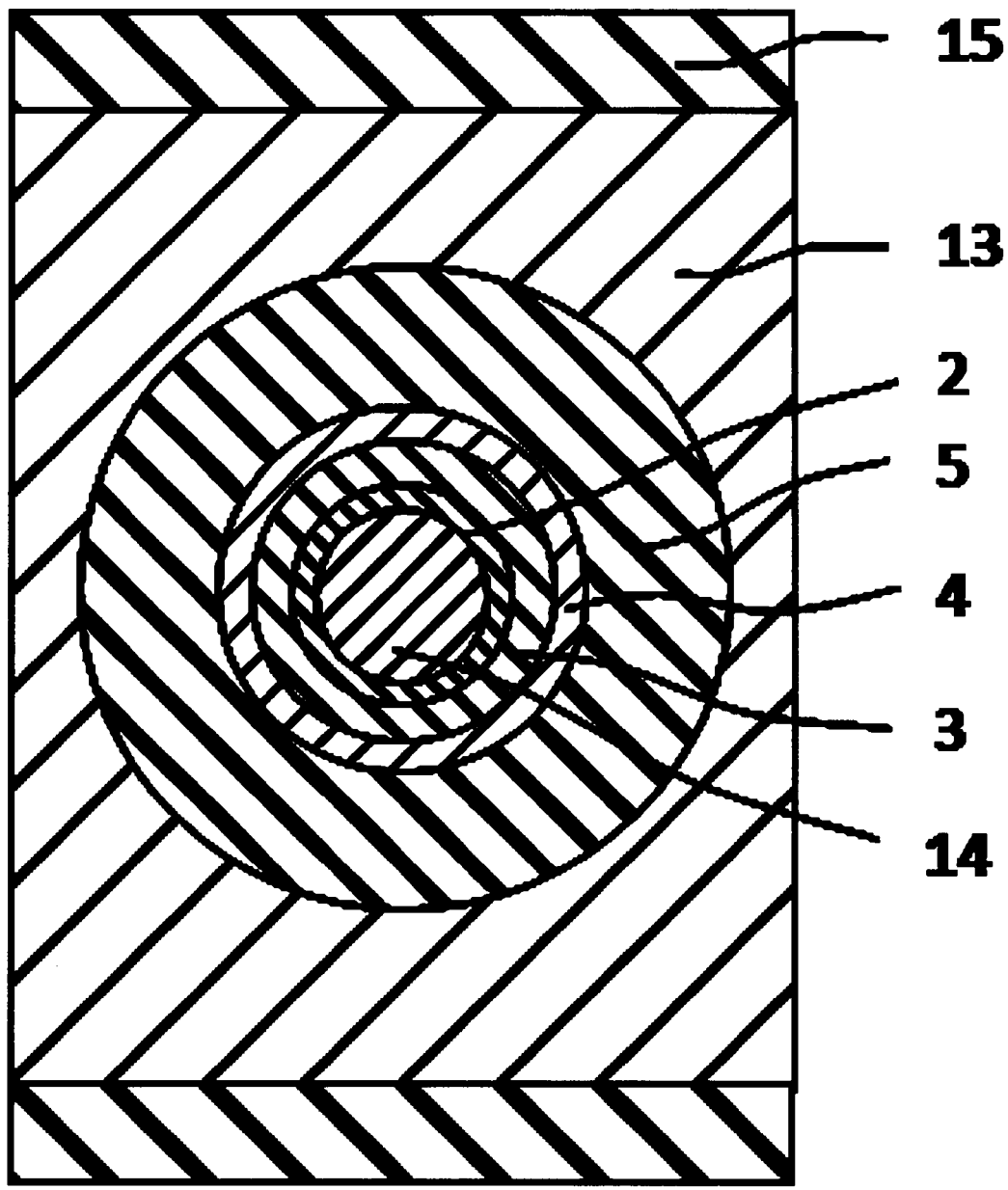
FIG. 11 is a plan view showing a memory cell of the nonvolatile semiconductor memory device according to the fifth embodiment.

As shown in FIG. 11, in a memory cell portion, a silicon pillar 14 as a semiconductor region through the insulators 12 and the electrode films 13 in a direction substantially perpendicular to a silicon substrate is provided above the silicon substrate. An aluminum oxide film, for example, is provided as an interface region 2 so as to be in contact with a surface of the silicon pillar 14. The surface density of the metallic element contained in the interface region 2 is ranged between $1\times10^{12}$ atoms/cm$^2$ and $1\times10^{16}$ atoms/cm$^2$, both inclusive, or particularly, preferably between $4\times10^{14}$ atoms/cm$^2$ and $3\times10^{15}$ atoms/cm$^2$, both inclusive. These surface densities correspond to thicknesses of 0.0003 to 3 nm and 0.1 to 1 nm, respectively, of the interface region 2.

A silicon oxide film, for example, is provided as a tunnel insulator 3 so as to be in contact with a surface of the interface region 2. A silicon nitride film, for example, is provided as a charge storage insulator 4 so as to be in contact with a surface of the tunnel insulator 3. A silicon oxide film, for example, is provided as a block insulator 5 so as to be in contact with a surface of the charge storage insulator 4. Silicon films doped with impurities, for example, are provided as the electrode films 13 so as to be in contact with a surface of the block insulator 5. A silicon oxide film, for example, is provided as the isolation insulator 15 in the insulators 12 and the electrode films 13. By the above, a layered film constituted with the tunnel insulator 3, the charge storage insulator 4, the block insulator 5, and the electrode films 13, in sequence, is provided so as to surround the silicon pillar 14, thereby providing a MONOS structure.

The interface region 2 containing the metallic element may be formed on the interface of at least one of the silicon pillar 14, the tunnel insulator 3, the charge storage insulator 4, the block insulator 5, and the electrode films 13.

Figure 12:
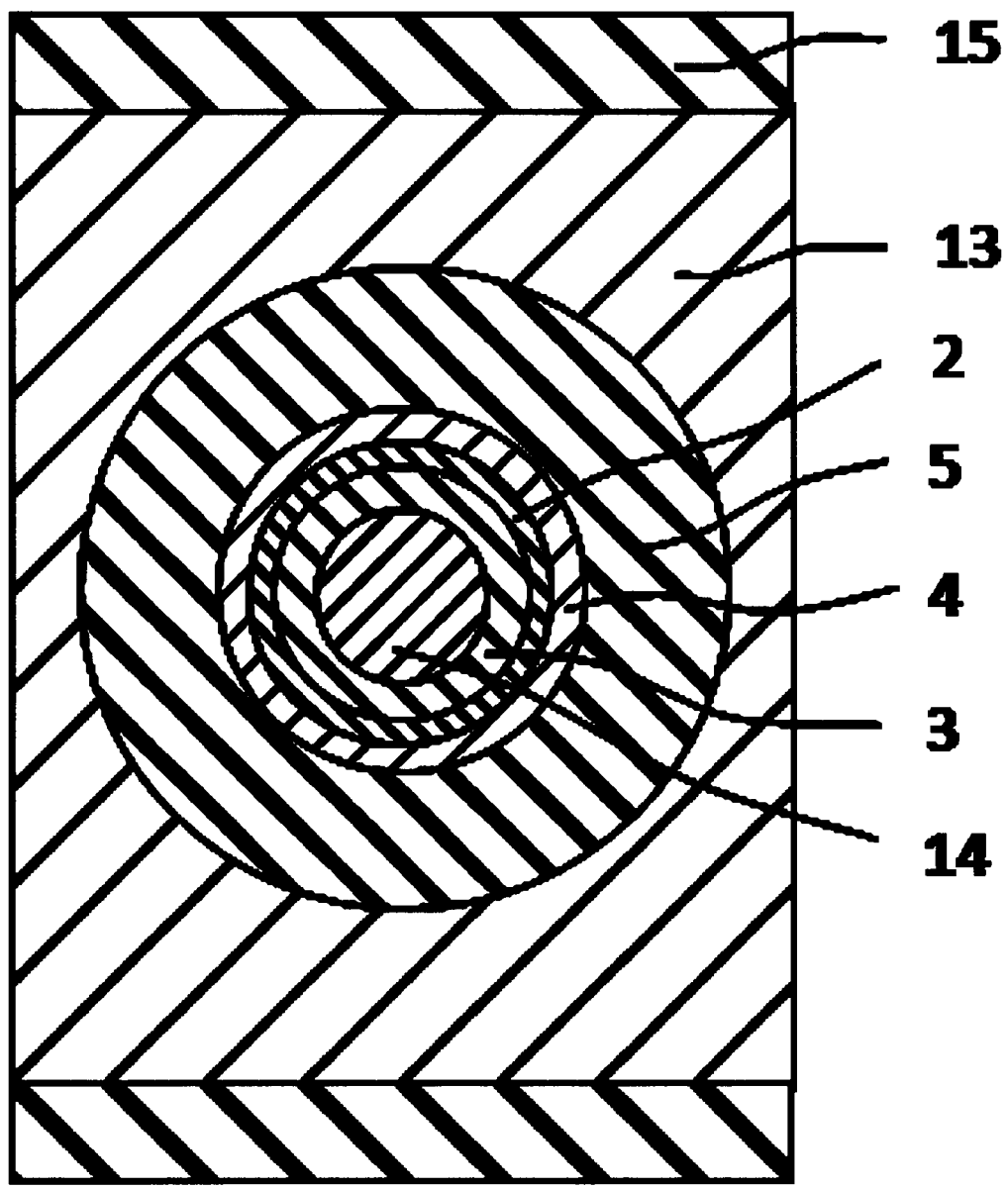
FIG. 12 is a plan view showing a memory cell of the nonvolatile semiconductor memory device according to the fifth embodiment.
Figure 13:
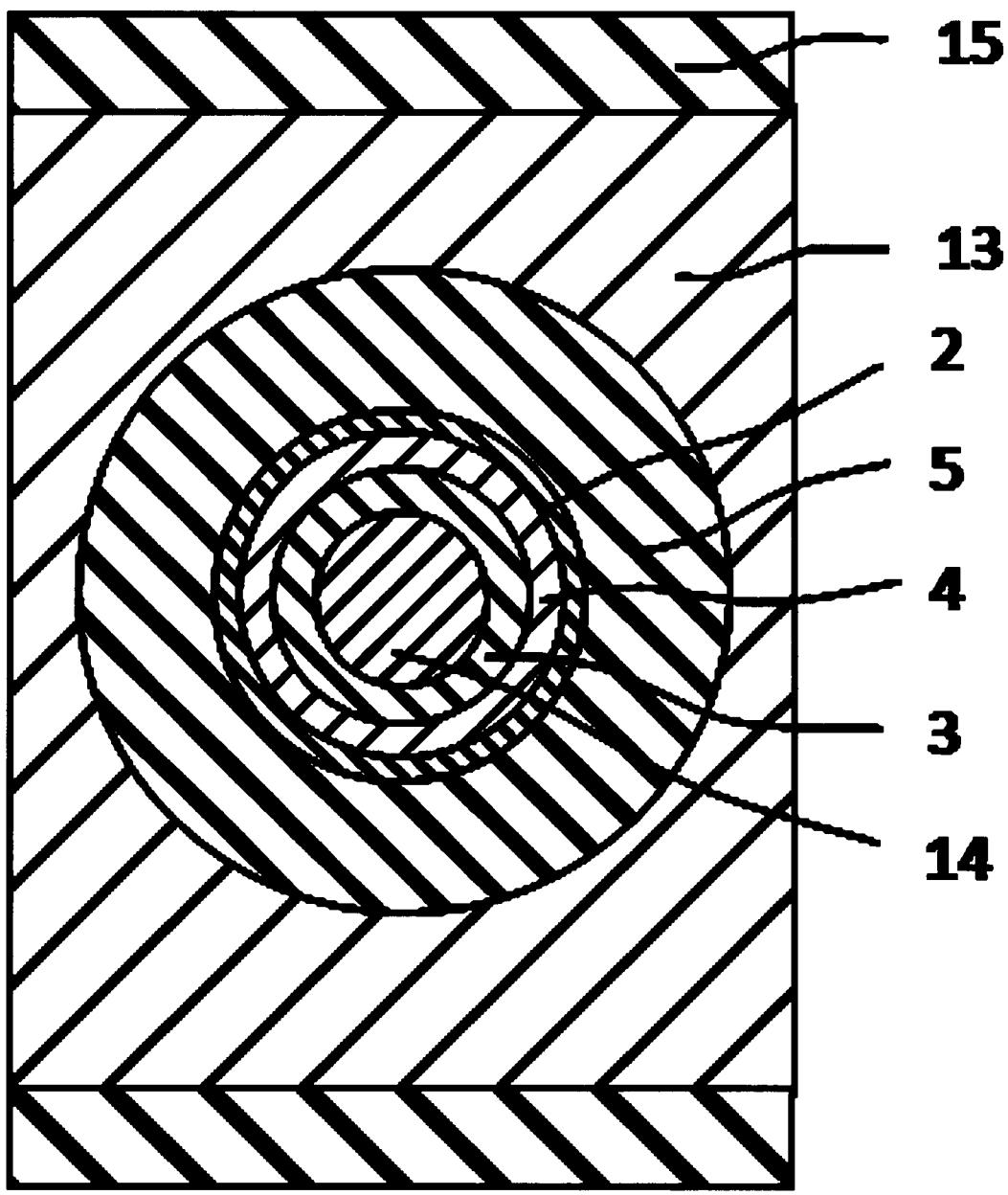
FIG. 13 is a plan view showing a memory cell of the nonvolatile semiconductor memory device according to the fifth embodiment.
Figure 14:
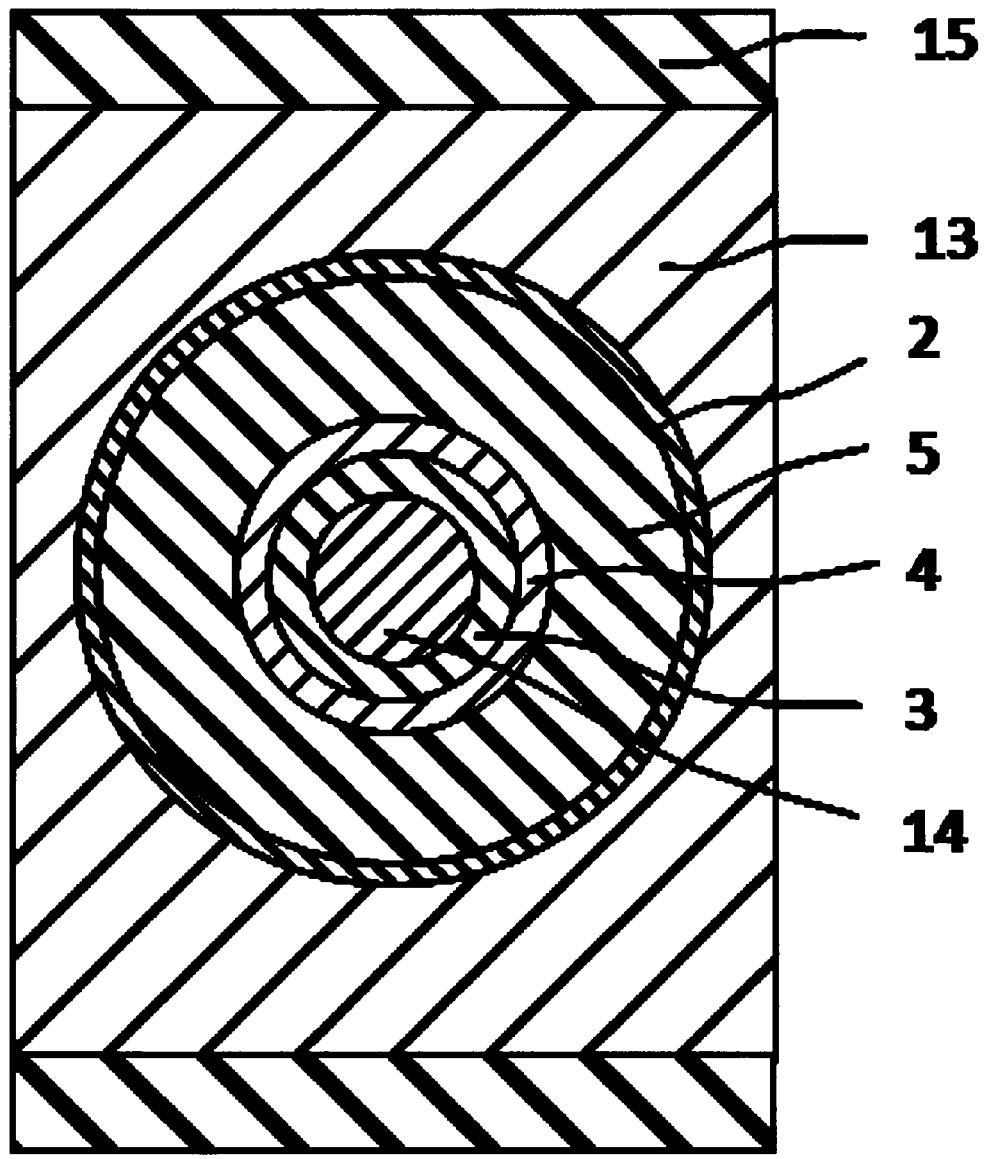
FIG. 14 is a plan view showing a memory cell of the nonvolatile semiconductor memory device according to the fifth embodiment.

The interface region 2 may be provided between the tunnel insulator 3 and the charge storage insulator 4 as shown in FIG. 12, between the charge storage insulator 4 and the block insulator 5 as shown in FIG. 13, or between the block insulator 5 and the electrode films 13 as shown in FIG. 14, rather than between the silicon pillar 14 and the tunnel insulator 3. Also in this case, the interface region 2 is formed, and thus, the advantageous effect of the fifth embodiment can be achieved.

A method of fabricating the nonvolatile semiconductor memory device according to the fifth embodiment will be described below.

First, a back gate insulator 10 and a back gate conductor 11 are formed above a semiconductor substrate 1, and insulators 12 and electrode films 13 are stacked one on top of another in layers, alternating with each other, above the back gate conductor 11.

After that, the insulators 12 and the electrode films 13 are subjected to etching in order to form a hole (not shown) in which a memory cell portion is to be provided.

Then, a block insulator 5 is formed on an inner surface of the hole formed by the etching. The block insulator 5 is formed in a film thickness of 2 to 20 nm, for example, by reduced pressure CVD allowing dichlorosilane to react with nitrous oxide at about 800° C.

Then, a silicon nitride film, for example, is formed as a charge storage insulator 4 on an inner surface of the block insulator 5. The charge storage insulator 4 is formed in a film thickness of, for example, 0.5 to 15 nm, for example by reduced pressure CVD method allowing dichlorosilane to react with ammonia at about 800° C.

Then, a silicon oxide film, for example, is formed as a tunnel insulator 3 on an inner surface of the charge storage insulator 4. The tunnel insulator 3 is formed in a film thickness of, for example, 0.5 to 15 nm, for example by CVD or ALD.

Then, an interface region 2 is formed on a surface of the tunnel insulator 3. The interface region 2 is an aluminum oxide film, for example, and besides, the interface region 2 is not limited to being formed as a film, provided that the interface region 2 contains a metallic element such as aluminum.

An aluminum oxide film, or an oxide film selected from magnesium oxide, calcium oxide, strontium oxide, lanthanum oxide, tungsten oxide, tantalum oxide, and the like, for example, (hereinafter called the aluminum oxide film or the like) is used for the interface region 2. Also, besides, a layered structure of these oxide films and a silicon oxide film may be used. The interface region 2 is a metal oxide film containing the above-described metallic elements, for example. Incidentally, the interface region 2 may be composed of a metallic element with low surface density, and is not limited to being formed as a film. Even in such a case, the interface region 2 containing the metallic element functions as a single interface region, and achieves the advantageous effect of the fifth embodiment.

Incidentally, it is to be understood that the metallic element contained in the interface region 2 is not limited only to a non-transition metal element, and the advantageous effect of the fifth embodiment can be achieved even with a transition metal element such as hafnium (Hf), zirconium (Zr), lanthanum (La), titanium (Ti), or tantalum (Ta). When the transition metal element is used for the interface region 2, such a process as to minimize oxygen defects is required at the time of formation of the interface region 2. For example, the process is to increase an oxidation time, to increase an oxidation temperature, or to do the like. Also, when the silicon oxide film is formed at the upper portion of the interface region 2, heat treatment, radical processing, or the like takes place in an atmosphere of oxidation, and a process to supply sufficient oxygen is required so as to reduce the oxygen defects.

Also, it is to be understood that the metallic element contained in the interface region 2 is not limited to the above. When different types of oxides and insulators are stacked one on top of another in layers, the metal insulator may be selected, provided that the effect of reducing the leakage current or doing the like can be achieved.

The interface region 2 is deposited for example by ALD. Formation is accomplished by introducing trimethyl aluminum and an oxidizing agent such as $O_2$, $O_3$, or $H_2$ into a furnace, and allowing them to react with each other at about 300° C. Besides, reduced pressure CVD, PVD, sputtering, MBE, coating, spray, or the like may be used for the formation. The interface region 2 formed may be subjected to annealing in order to achieve high density, or may be subjected to an oxidation process in order to compensate for oxygen defects.

The interface region 2 is formed in a range from $1\times10^{12}$ atoms/cm$^2$ to $1\times10^{16}$ atoms/cm$^2$, both inclusive, in terms of aluminum surface density. Therefore, the interface region 2 is formed in a range from about 0.0003 to 3 nm in terms of thickness. According to the ALD, the interface region 2 can be formed at about $1\times10^{14}$ atoms/cm$^2$ with good controllability. Preferably, the interface region 2 is formed in a range of $4\times10^{14}$ atoms/cm$^2$ to $3\times10^{15}$ atoms/cm$^2$, both inclusive, or equivalently, in a range of 0.1 to 1 nm in terms of thickness. According to the ALD, the interface region 2 can be formed with good controllability at a surface density of about $1\times10^{14}$ atoms/cm$^2$ of the metallic element.

After that, a silicon layer is formed as a silicon pillar 14 on an inner surface of the interface region 2.

Incidentally, a silicon nitride film (not shown) may be formed on the interface between the silicon pillar 14 and the tunnel insulator 3. This is for the purpose of suppressing the leakage current during application of high electric field, or suppressing surface deterioration of the tunnel insulator 3 in a process during fabrication. At this time, the interface region 2 containing the metallic element may be formed on the interface between the silicon nitride film and the tunnel insulator 3. Thereby, while the above-described function of the silicon nitride film is imparted to the interface region 2, the advantageous effect of the fifth embodiment can be achieved.

Incidentally, description has been given with regard to an instance where the tunnel insulator 3, the charge storage insulator 4, and the block insulator 5 are each a single layer. However, a silicon oxide film, a silicon nitride film, a silicon oxide-nitride film, a metal oxide film, or a layered film of these may be used. When the interface region 2 is formed on the interface between the silicon pillar 14 as a channel and the tunnel insulator 3, the leakage current during reading can be reduced. When the same electric field is applied, the leakage current can be reduced, and thus, the tunnel insulator can be reduced in film thickness, so that an improvement in writing/erasing characteristics and high performance of the element can be achieved.

When the interface region 2 is formed on the interface between the tunnel insulator 3 and the charge storage insulator 4, leakage of electrons from the charge storage insulator 4 can be suppressed, and thus, charge retention characteristics of the element can be improved.

When the interface region 2 is formed on the interface between the charge storage insulator 4 and the block insulator 5, the leakage of electrons from the charge storage insulator 4 can be suppressed, and thus, the charge retention characteristics of the element can be improved. Also, during writing, the leakage of accumulated charge from the charge storage insulator 4 can be suppressed, and thus, writing characteristics can be improved.

When the interface region 2 is formed on the interface between the block insulator 5 and the electrode films 13, electron injection from the control electrode during erasing can be suppressed, and thus, erasing characteristics can be improved.

Also, when the metal oxide film is formed on the interface region 2, the insulator with little deterioration by stress during writing or erasing can be formed for the tunnel insulator 3 or the block insulator 5 adjacent to the interface region 2. This point out that the metal oxide film is formed on the interface thereby to suppress formation of defects such as trapped charge due to stress application.

In the description of the fifth embodiment, for formation of the memory cell portion, the block insulator 5, the charge storage insulator 4, the tunnel insulator 3, and the silicon pillar 14 are formed in sequence on the inner surface of the memory hole. Meanwhile, when the silicon pillar 14, the tunnel insulator 3, the charge storage insulator 4, and the block insulator 5 are formed in sequence, the advantageous effect of the fifth embodiment can be achieved in the same manner.

Also, in the fifth embodiment, description has been given with regard to the three-dimensional nonvolatile semiconductor memory device in which the silicon pillar 14 as the channel is formed in a direction perpendicular to the semiconductor substrate 1. However, it is to be understood that the invention is not so limited. In a three-dimensional nonvolatile semiconductor memory device in which the channel is formed in a direction horizontal to the semiconductor substrate 1, even when a modified three-dimensional nonvolatile semiconductor memory device is formed by a combination of sequential formation starting at the block insulator 5 and sequential formation starting at the channel for the memory cell portion, the advantageous effect of the fifth embodiment can be achieved.

Various modifications will become possible for those skilled in the art after receiving the teachings of the present disclosure without departing from the scope thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   insulators and electrodes alternately provided above a semiconductor substrate;
   a silicon pillar penetrating the insulator and the electrode;
   a tunnel insulator surrounding a sidewall of the silicon pillar;
   a charge storage insulator surrounding a sidewall of the tunnel insulator;
   a block insulator surrounding a sidewall of the charge storage insulator; and
   an interface region including a metal element, the interface region being provided at one interface selected from between the sidewall of the silicon pillar and the tunnel insulator, the tunnel insulator and the charge storage insulator, the charge storage insulator and the block insulator, and the block insulator and the electrodes.

2. The nonvolatile semiconductor memory device of claim 1, wherein
   a surface density of the interface region is ranged from $1.0\times10^{12}$ atoms/cm$^2$ to $1\times10^{16}$ atoms/cm$^2$.

3. The nonvolatile semiconductor memory device of claim 2, wherein
   the surface density of the interface region is ranged from $4.0\times10^{14}$ atoms/cm$^2$ to $3\times10^{15}$ atoms/cm$^2$.

4. The nonvolatile semiconductor memory device of claim 1, wherein
   a film thickness of the interface region is ranged from 0.0003 nm to 3 nm.

5. The nonvolatile semiconductor memory device of claim 4, wherein
the film thickness of the interface region is ranged from 0.1 nm to 1 nm.

6. The nonvolatile semiconductor memory device of claim 1, wherein
the interface region includes a metal element selected from aluminum, magnesium, strontium, calcium, lanthanum, tungsten or tantalum.

7. The nonvolatile semiconductor memory device of claim 1, wherein
the interface region is constituted with a layered structure including a metal oxide film and an silicon oxide film, the metal oxide film including a metal element selected from aluminum, magnesium, strontium, calcium, lanthanum, tungsten or tantalum.

8. The nonvolatile semiconductor memory device of claim 7, wherein
the layered structure is constituted with a plurality of films selected from the metal oxide film and the silicon oxide film, the silicon oxide film and the metal oxide film, the metal oxide film, the silicon oxide film and the metal oxide film, or the metal oxide film, the silicon oxide film, the metal oxide film, the silicon oxide film and the metal oxide film.

9. The nonvolatile semiconductor memory device of claim 1, wherein
a nitride film is provided at an interface between the sidewall of the interface region and one region selected from the sidewall of the semiconductor region, the sidewall of the tunnel insulator, the sidewall of the charge storage insulator, the sidewall of the block insulator and the sidewall of the control gate electrode.

* * * * *